(12) United States Patent
Kong

(10) Patent No.: US 12,098,857 B2
(45) Date of Patent: Sep. 24, 2024

(54) WIRELESS COMMUNICATION DEVICE AND AIR CONDITIONER

(71) Applicants: GD MIDEA AIR-CONDITIONING EQUIPMENT CO., LTD., Foshan (CN); MIDEA GROUP CO., LTD., Foshan (CN)

(72) Inventor: Shumiao Kong, Foshan (CN)

(73) Assignees: GD MIDEA AIR-CONDITIONING EQUIPMENT CO., LTD., Foshan (CN); MIDEA GROUP CO., LTD., Foshan (CN)

( * ) Notice: Subject to any disclaimer, the term of this patent is extended or adjusted under 35 U.S.C. 154(b) by 160 days.

(21) Appl. No.: 17/312,595

(22) PCT Filed: Oct. 28, 2019

(86) PCT No.: PCT/CN2019/113662
§ 371 (c)(1),
(2) Date: Jun. 10, 2021

(87) PCT Pub. No.: WO2020/119288
PCT Pub. Date: Jun. 18, 2020

(65) Prior Publication Data
US 2022/0057096 A1  Feb. 24, 2022

(30) Foreign Application Priority Data

Dec. 11, 2018 (CN) .......................... 201811512972.3
Dec. 11, 2018 (CN) .......................... 201822077548.2

(51) Int. Cl.
G08C 17/02   (2006.01)
F24F 11/56   (2018.01)
H03B 5/32    (2006.01)

(52) U.S. Cl.
CPC .............. *F24F 11/56* (2018.01); *G08C 17/02* (2013.01); *H03B 5/32* (2013.01)

(58) Field of Classification Search
CPC ........... F24F 11/56; F24F 11/88; G08C 17/02; H04L 12/282; H04W 40/02
See application file for complete search history.

(56) References Cited

U.S. PATENT DOCUMENTS

| 6,175,530 | B1 | 1/2001 | Theron et al. | |
| 6,487,618 | B1 | 11/2002 | Theron et al. | |
| 6,587,965 | B1* | 7/2003 | Shaeffer | G01R 31/31713 714/28 |
| 7,665,002 | B1* | 2/2010 | White | G01R 31/31705 714/733 |

(Continued)

FOREIGN PATENT DOCUMENTS

| CN | 101806487 A | 8/2010 |
| CN | 202032701 U | 11/2011 |

(Continued)

OTHER PUBLICATIONS

The European Patent Office (EPO) Extended Search Report for EP Application No. 19894985.1 Dec. 8, 2021 8 Pages.

(Continued)

*Primary Examiner* — Vernal U Brown
(74) *Attorney, Agent, or Firm* — Anova Law Group, PLLC

(57) ABSTRACT

A wireless communication device includes a main control chip and an outline interface. The main control chip includes a reset pin configured to reset the main control chip and a debug serial port input pin configured to read and detect a running state of a program. The debug serial port input pin is connected to a direct-current power source to receive a high voltage level input. The reset pin is disconnected from an input pin of the outline interface.

18 Claims, 5 Drawing Sheets

(56) References Cited

U.S. PATENT DOCUMENTS

| | | | |
|---|---|---|---|
| 9,934,829 B1* | 4/2018 | Lin | G11C 8/12 |
| 10,409,296 B1* | 9/2019 | Elle | G05D 7/0635 |
| 2009/0147805 A1* | 6/2009 | Wada | H01P 1/2135 |
| | | | 370/497 |
| 2011/0112692 A1* | 5/2011 | Chan | F24F 11/62 |
| | | | 455/66.1 |
| 2015/0048521 A1* | 2/2015 | Kwon | H01L 25/105 |
| | | | 257/777 |
| 2017/0005637 A1* | 1/2017 | Nakamura | H03H 9/1085 |
| 2018/0151004 A1 | 5/2018 | Gintz et al. | |
| 2018/0212792 A1 | 7/2018 | Brandt | |
| 2019/0228281 A1* | 7/2019 | Lu | G06K 19/07707 |

FOREIGN PATENT DOCUMENTS

| | | |
|---|---|---|
| CN | 105681207 A | 6/2016 |
| CN | 107504645 A | 12/2017 |
| CN | 108696367 A | 10/2018 |
| CN | 109282437 A | 1/2019 |
| CN | 209181193 U | 7/2019 |
| JP | 2000076576 A | 3/2000 |
| JP | 2003101439 A | 4/2003 |
| WO | 2018196528 A1 | 11/2018 |

OTHER PUBLICATIONS

The China National Intellectual Property Administration (CNIPA) The First Office Action for Chinese Application 201811512972.3 Aug. 1, 2022 9 Pages (With Translation).
World Intellectual Property Organization (WIPO) International Search Report and Written Opinion for PCT/CN2019/113662 with translation Jan. 23, 2020 16 Pages.
The European Patent Office (EPO) The Communication pursuant to Article 94(3) EPC for EP Application No. 19894985.1 Oct. 26, 2023 5 Pages.

* cited by examiner

WIRELESS COMMUNICATION DEVICE AND AIR CONDITIONER

CROSS-REFERENCE TO RELATED APPLICATIONS

This application is a National Stage Entry under 35 U.S.C. § 371 of International Application No. PCT/CN2019/113662, filed on Oct. 28, 2019, which claims priority to Chinese Patent Application Nos. 201811512972.3 and 201822077548.2, both with application name of "Wireless Communication device and Air Conditioner" and filed on Dec. 11, 2018, by GD MIDEA AIR-CONDITIONING EQUIPMENT CO., LTD. and MIDEA GROUP CO., LTD., the entire contents of all of which are incorporated herein by reference.

FIELD

The present disclosure relates to the technical field of air conditioner, in particular to a wireless communication device and an air conditioner.

BACKGROUND

With the development of science and technology, home appliances such as air conditioner are becoming more and more intelligent. For example, an intelligent air conditioner can be controlled by mobile terminals, in which the intelligent air conditioner is equipped with a wireless communication device to realize wireless communication between the intelligent air conditioner and external devices (such as a smart phone), thus improving the convenience of controlling the air conditioner.

However, the current wireless communication device is prone to malfunctions such as system halting, disconnection or the like when being interfered, which seriously affects the quality of air conditioner and the user experience. Therefore, how to improve the anti-interference ability of the wireless communication device has become an urgent problem to be solved in the circuit design of wireless communication device.

SUMMARY

The present disclosure aims to solve one of the technical problems in the related art at least to a certain extent.

For this, one object of the present disclosure is to propose a wireless communication device, in which a reset pin of a main control chip of the wireless communication device is disconnected from an input pin of an outline interface and the debug serial port input pin of the main control chip is connected to a high voltage level, such that the wireless communication device will not be affected by the electromagnetic interference input in the outline interface, thereby improving the anti-interference ability of the wireless communication device, ensuring the stability of program in the wireless communication device and avoiding network disconnection as much as possible.

Another object of the present disclosure is to propose an air conditioner.

For this object, embodiments of a first aspect of the present disclosure provide a wireless communication device, comprising a main control chip, an outline interface and a power supply circuit, wherein the main control chip comprises a reset pin and a debug serial port input pin, and wherein the reset pin is configured to reset the main control chip,
the debug serial port input pin is configured to read and detect a running state of a program,
the reset pin is disconnected from an input pin of the outline interface, and
the debug serial port input pin is connected to a first direct-current power source to input a high voltage level.

In a possible implementation manner of embodiments of the present disclosure, a fixed-value resistor is connected between the debug serial port input pin of the main control chip and the first direct-current power source.

In a possible implementation manner of embodiments of the present disclosure, a resistance value of the fixed-value resistor is any value from 4 kiloohms to 20 kiloohms, and an input voltage level of the debug serial port input pin is 3.3 volts.

In a possible implementation manner of embodiments of the present disclosure, the wireless communication device further comprises a first resistor and a first capacitor, wherein
one end of the first capacitor is connected to a second direct-current power source and the other end of the first capacitor is grounded, and
one end of the first resistor is connected to the reset pin and the other end of the first resistor is connected to the second direct-current power source.

In a possible implementation manner of embodiments of the present disclosure, the wireless communication device further comprises a clock oscillator circuit, wherein the clock oscillator circuit comprises a crystal, a second capacitor and a third capacitor,
one end of the second capacitor is connected to one end of the crystal and the other end of the second capacitor is grounded,
one end of the third capacitor is connected to the other end of the crystal and the other end of the third capacitor is grounded, and
the main control chip further comprises a crystal oscillator input pin and a crystal oscillator output pin, wherein the crystal oscillator input pin is connected to one end of the crystal and the crystal oscillator output pin is connected to the other end of the crystal.

In a possible implementation manner of embodiments of the present disclosure, the wireless communication device further comprises a radio frequency input and output pin,
the radio frequency input and output pin is connected to an antenna and configured to receive data sent by an external device through the antenna and send data output by the main control chip to an external device through the antenna.

In a possible implementation manner of embodiments of the present disclosure, the radio frequency input and output pin is connected to the antenna through an inductor.

In a possible implementation manner of embodiments of the present disclosure, the wireless communication device further comprises a memory chip, wherein the memory chip comprises four serial data input and output pins, a clock input pin, an enable pin, a ground pin and a power supply pin, and
the four serial data input and output pins, the clock input pin and the enable pin are respectively connected to different general-purpose input and output pins of the main control chip.

In a possible implementation manner of embodiments of the present disclosure, the wireless communication device further comprises a power supply circuit, wherein input ends of the power supply circuit are respectively connected to a power supply pin of the main control chip, a power supply pin of the outline interface and the power supply pin of the memory chip to supply power to the main control chip, the outline interface and the memory chip.

According to the wireless communication device in embodiments of the present disclosure, the reset pin of the main control chip of the wireless communication device is disconnected from an input pin of the outline interface and the debug serial port input pin of the main control chip is connected to a power source to input a high voltage level, such that the wireless communication device will not be affected by the electromagnetic interference input in the outline interface, thereby improving the anti-interference ability of the wireless communication device, ensuring the stability of program in the wireless communication device and avoiding network disconnection as much as possible. Therefore, the wireless communication quality of the air conditioner using the wireless communication device can be improved, thus the user experience is improved accordingly.

For the foregoing object, embodiments of a second aspect of the present disclosure provide an air conditioner comprising the wireless communication device as described in embodiments of the first aspect.

The additional aspects and advantages of the present disclosure will be partially given in the following description, and some of them will become apparent from the description in the below or be understood through the practice of the present disclosure.

BRIEF DESCRIPTION OF THE DRAWINGS

To clearly describe the technical solutions in embodiments of the present disclosure or of the existing technologies, the drawings needed to be used in the description of present embodiments or the existing technologies are briefly described. Apparently, the drawings described below are only some examples of the present disclosure, and ordinary skill persons in the art can obtain other drawings based on these present drawings without creative labor. In which.

DETAILED DESCRIPTION

Figure 1:
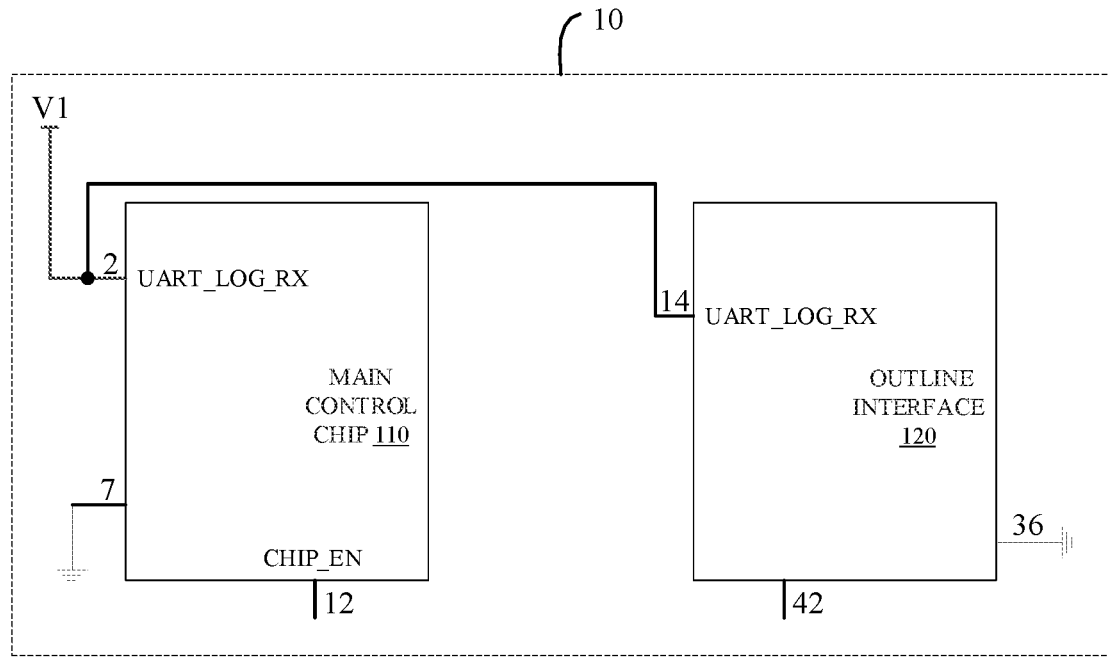
FIG. 1 is a schematic structural diagram of a wireless communication device provided in Embodiment 1 of the present disclosure.

The embodiments of the present disclosure are described in detail below. Examples of the embodiments are shown in the drawings, in which the same or similar reference numerals indicate the same or similar elements or elements with the same or similar functions. The embodiments described below with reference to the drawings are exemplary and are intended to explain the present disclosure, which should not be construed as limiting the present disclosure.

The wireless communication device and the air conditioner according to embodiments of the present disclosure are described below with reference to the drawings.

FIG. 1 is a schematic structural diagram of a wireless communication device provided in Embodiment 1 of the present disclosure.

As shown in FIG. 1, the wireless communication device 10 includes a main control chip 110 and an outline interface 120.

The main control chip 110 includes a reset pin (CHIP_EN, pin 12) and a debug serial port input pin (UART_LOG_RX, pin 2). The reset pin is configured to reset the main control chip 110. The debug serial port input pin is configured to read and detect a running state of a program in the main control chip 110.

In this embodiment, as shown in FIG. 1, the reset pin of the main control chip 110 is disconnected from an input pin (pin 42) of the outline interface, and the debug serial port input pin of the main control chip 110 is connected to a first direct-current power source (marked as V1 in FIG. 1) to input a high voltage level. The debug serial port input pin of the main control chip 110 is also connected to a debug serial port input pin (pin 14) of the outline interface 120.

It is worth mentioning that the outline interface 120 in the wireless communication device 10 will inevitably be affected by external electromagnetic interference during the operation of the wireless communication device 10. It is assumed that the reset pin of the main control chip 110 is connected to the input pin (42 pin) of the outline interface 120. When the outline interface 120 receives electromagnetic signal interference, the received electromagnetic signal interference would make the input voltage level of the reset pin of the main control chip 110 unstable. When accumulating to a certain threshold, the unstable voltage level will interfere with the normal operation of the program in the main control chip 110, thereby causing malfunctions of the wireless communication device 10, such as system halting, disconnection or the like.

In contrast, according to embodiments of the present disclosure, the reset pin of the main control chip 110 is disconnected from the input pin (pin 42) of the outline interface 120. Thus, when the outline interface 120 receives electromagnetic signal interference, such an electromagnetic signal interference received by the outline interface 120 would not be transported to the reset pin of the main control chip 110, such that the input voltage level of the reset pin of the main control chip 110 remains stable, thereby avoiding the abnormal operation of the program of the main control chip 110 caused by the unstable input voltage level of the reset pin, and improving the anti-interference ability of the wireless communication device 10.

Further, in this embodiment, the debug serial port input pin of the main control chip 110 is connected to the first direct-current power source V1 to input a high voltage level to the debug serial port, such that the debug serial port input pin of the main control chip 110 keeps a stable high-voltage level, thus preventing the debug serial port input pin of the main control chip 110 from being affected by the fluctuations of external voltage level and preventing the normal operation of program in the main control chip 110 from being affected, thereby further avoiding the generation of network disconnection, thus improving the anti-interference ability of the wireless communication device 10.

Figure 2:
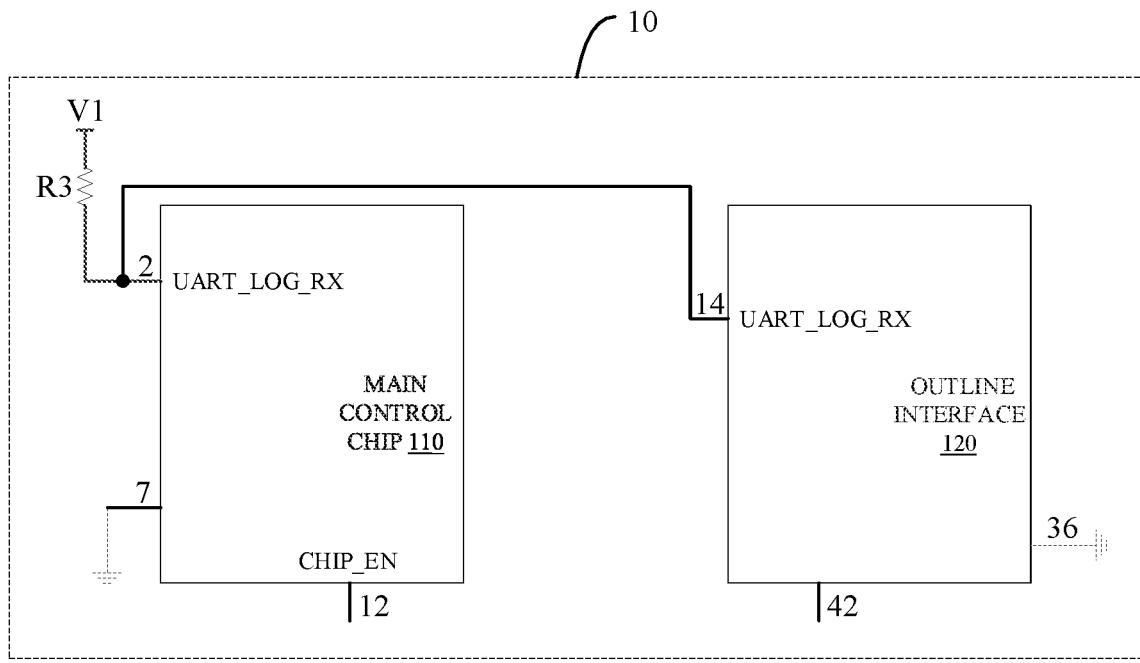
FIG. 2 is a schematic structural diagram of a wireless communication device provided in Embodiment 2 of the present disclosure.

In a possible implementation manner of embodiments of the present disclosure, as shown in FIG. 2, a fixed-value resistor (marked as R3 in FIG. 2) is connected between the debug serial port input pin of the main control chip 110 and the first direct-current power source V1 based on the embodiment shown in FIG. 1, so that the input voltage level of the debug serial port input pin of the main control chip 110 is maintained at a stable level.

As a possible implementation manner, the debug serial port input pin of the main control chip 110 is connected to the first direct-current power source through a fixed-value resistor having a resistance value of any value from 4 kiloohms to 20 kiloohms, such that the input voltage level of the debug serial port input pin of the main control chip 110 is maintained at a stable 3.3 volts. For example, the debug serial port input pin is connected to the first direct-current power source through a fixed-value resistor of 4 kiloohms, or a fixed-value resistor of 10 kiloohms, or a fixed-value resistor of 20 kiloohms, or the like.

Figure 3:
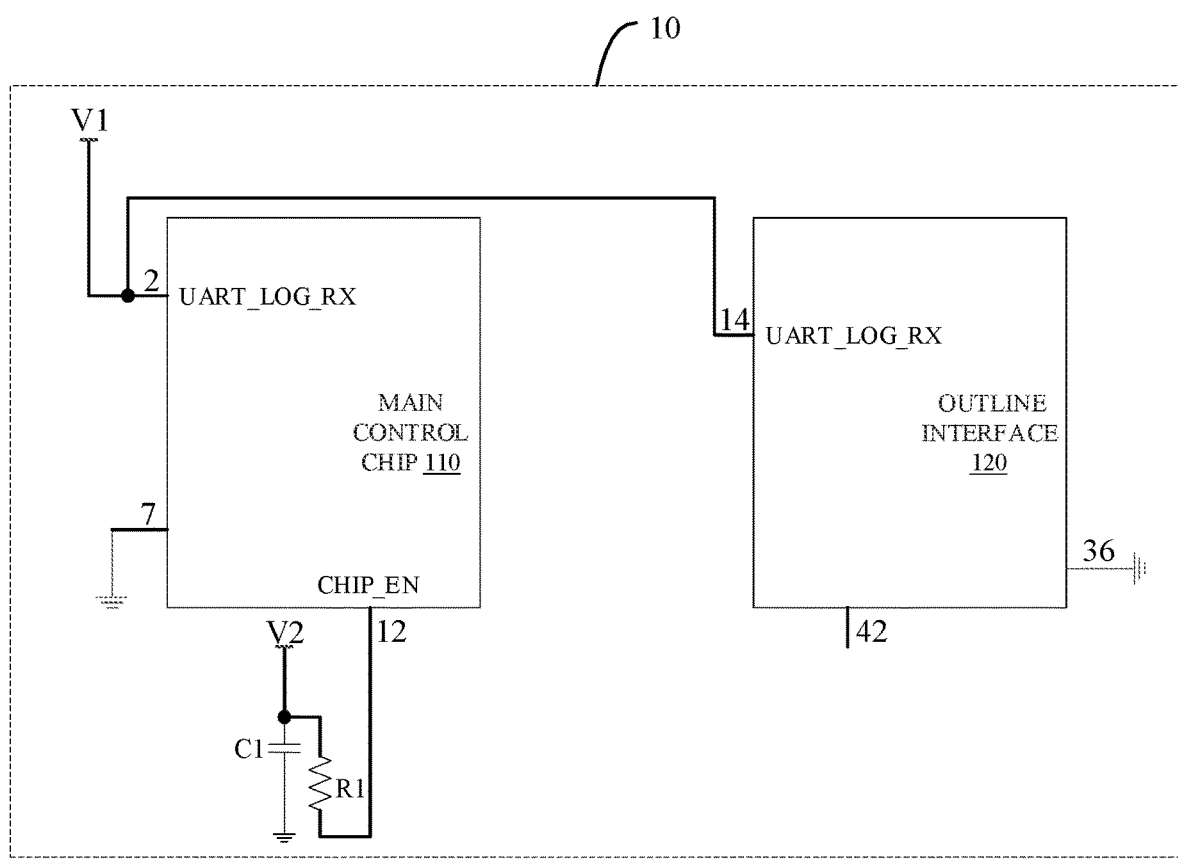
FIG. 3 is a schematic structural diagram of a wireless communication device provided in Embodiment 3 of the present disclosure.

In a possible implementation manner of embodiments of the present disclosure, as shown in FIG. 3, the wireless communication device 10 further includes a first resistor (marked as R1 in FIG. 3) and a first capacitor (marked as C1 in FIG. 3) based on the embodiment shown in FIG. 1.

One end of the first capacitor C1 is connected to a second direct-current power source (marked as V2 in FIG. 3) and the other end of the first capacitor C1 is grounded; and one end of the first resistor R1 is connected to the reset pin of the main control chip 110 and the other end of the first resistor R1 is connected to the second direct-current power source V2.

In this embodiment, the second direct-current power source V2 is connected to the reset pin of the main control chip 110 through the first resistor R1. The first resistor R1 plays a role in reducing voltage and current, which can prevent a too high input voltage level for the reset pin which generates a strong electromagnetic interference, thus ensuring the stability of the input voltage level of the reset pin.

Figure 4:
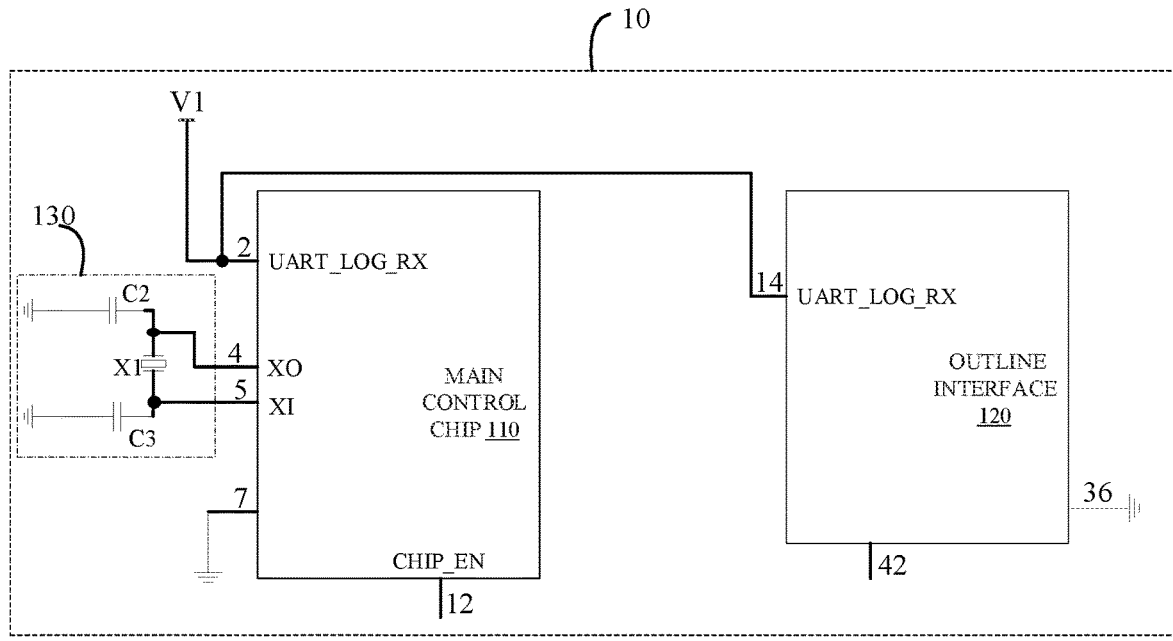
FIG. 4 is a schematic structural diagram of a wireless communication device provided in Embodiment 4 of the present disclosure.

In a possible implementation manner of embodiments of the present disclosure, as shown in FIG. 4, the wireless communication device 10 further includes a clock oscillator circuit 130 based on the embodiment shown in FIG. 1, in which the clock oscillator circuit 130 comprises a crystal (marked as X1 in FIG. 4), a second capacitor (marked as C2 in FIG. 4) and a third capacitor (marked as C3 in FIG. 4).

The crystal X1 may be for example a quartz crystal oscillator. The clock oscillator circuit 130 is configured to provide a reference frequency for the main control chip 110 to ensure the normal operation of the main control chip 110. In the clock oscillator circuit 130, one end of the second capacitor C2 is connected to one end of the crystal X1 and the other end of the second capacitor C2 is grounded. One end of the third capacitor C3 is connected to the other end of the crystal X1 and the other end of the third capacitor C3 is grounded.

In this embodiment, as shown in FIG. 4, the main control chip 110 further includes a crystal oscillator input pin (XI) and a crystal oscillator output pin (XO). The crystal oscillator input pin XI is connected to one end of the crystal X1 and the crystal oscillator output pin XO is connected to the other end of the crystal X1.

In actual wiring, the length of signal lines related to the crystal oscillator input pin XI and the crystal oscillator output pin XO is required to be shortened as much as possible. It is capable to effectively reduce the high-frequency interference by making the third capacitor C3 and the second capacitor C2 grounded.

Figure 5:
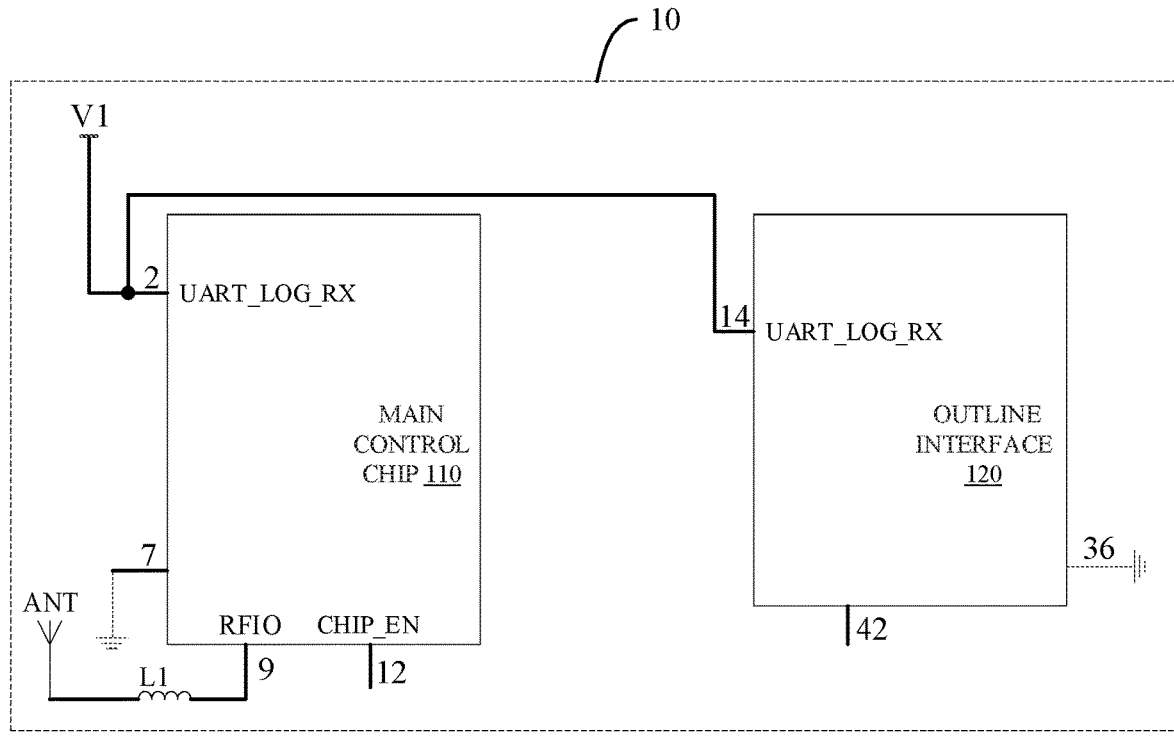
FIG. 5 is a schematic structural diagram of a wireless communication device provided in Embodiment 5 of the present disclosure.

In a possible implementation manner of embodiments of the present disclosure, as shown in FIG. 5, the main control chip 110 further includes a radio frequency input and output pin (marked as RFIO in FIG. 5, pin 9) based on the embodiment shown in FIG. 1.

In this embodiment, the radio frequency input and output pin RFIO is connected to an antenna (marked as ANT in FIG. 5) and configured to receive data sent by an external device through the antenna and send data output by the main control chip 110 to an external device through the antenna.

As shown in FIG. 5, the radio frequency input and output pin RFIO is connected to the antenna through an inductor (marked as L1 in FIG. 5). Thus, the matching degree between the antenna and the RFIO pin can be improved by connecting an inductor between the radio frequency input/output pin RFIO of the main control chip 110 and the antenna.

Further, in a possible implementation manner of embodiments of the present disclosure, a direct-current channel is provided at the end of the radio frequency input and output pin RFIO for grounding, so as to achieve the protection from electrostatic discharge (ESD), thus avoiding the interference of electromagnetic fields generated by electrostatic discharge currents to the main control chip 110, and preventing electrostatic discharge current from passing through the main control chip 110 to cause damage to the main control chip 110.

Figure 6:
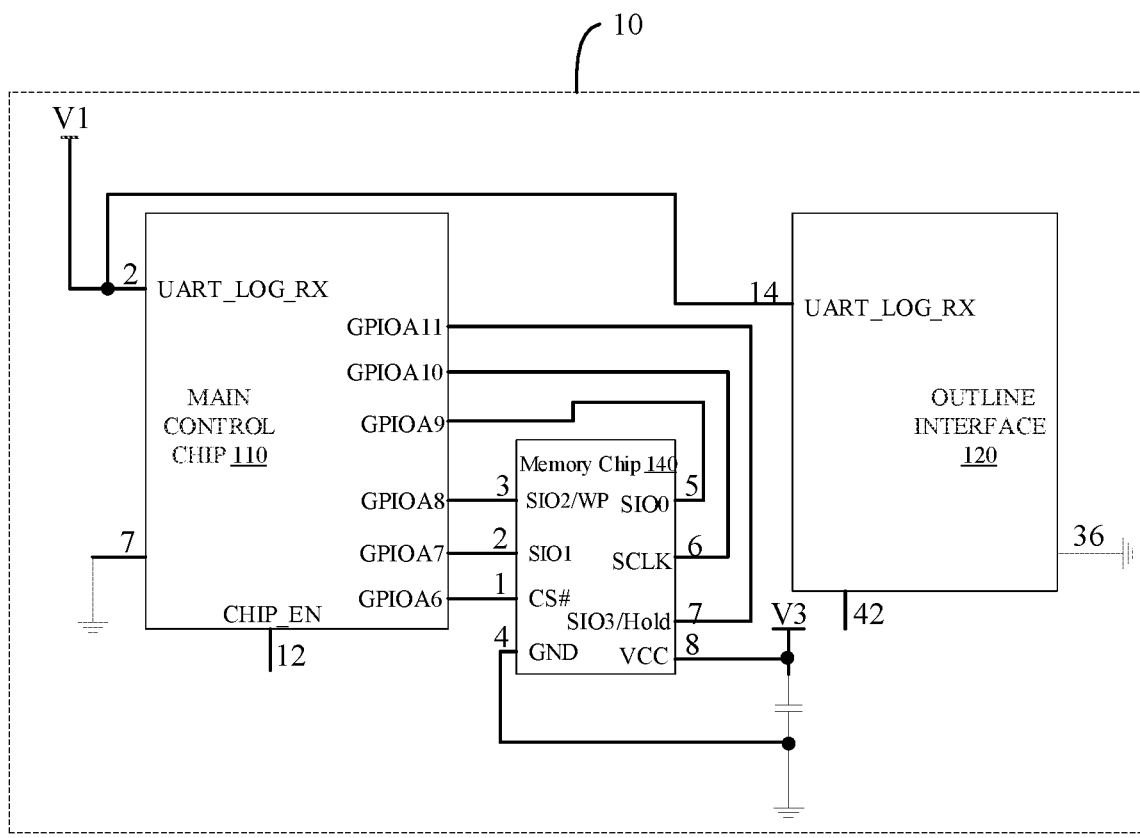
FIG. 6 is a schematic structural diagram of a wireless communication device provided in Embodiment 6 of the present disclosure.

In a possible implementation manner of embodiments of the present disclosure, as shown in FIG. 6, the wireless communication device 10 further includes a storage chip 140 based on the embodiment shown in FIG. 1.

As shown in FIG. 6, the memory chip 140 includes four serial data input and output pins (respectively marked as SIO0, SIO1, SIO2 and SIO3 in FIG. 6), a clock input pin (marked as SCLK in FIG. 6), an enable pin (respectively marked as CS # in FIG. 6), a ground pin (respectively marked as GND in FIG. 6) and a power supply pin (respectively marked as VCC in FIG. 6). The four serial data input and output pins, the clock input pin and the enable pin of the memory chip 140 are respectively connected to different general-purpose input and output pins (GPIOA) of the main control chip 110. The power supply pin is connected to a power source (marked as V3 in FIG. 6). The ground pin GND is grounded.

The serial data input and output pin SIO2 can also be called the WP pin, which is used as a protection pin. When the WP pin is input at a low voltage level, the data cannot be erased and modified. The serial data input and output pin SIO3 can also be called the Hold pin, which is used to prevent mistaken operation. When the Hold pin is input at a low voltage level, the main control chip 110 ignores all external commands so as to achieve the purpose of preventing mistaken operation. The SCLK pin is configured to provide timing for the data transmission of the serial data input and output pins.

In a possible implementation manner of embodiments of the present disclosure, the wireless communication device 10 further includes a power supply circuit. The input ends of the power supply circuit are respectively connected to a power supply pin of the main control chip 110, a power supply pin of the outline interface 120 and the power supply pin of the memory chip 140 to supply power to the main control chip 110, the outline interface 120 and the memory chip 140.

According to the wireless communication device in embodiments of the present disclosure, the reset pin of the main control chip of the wireless communication device is disconnected from an input pin of the outline interface and the debug serial port input pin of the main control chip is connected to a power source to input a high voltage level, such that the wireless communication device will not be affected by the electromagnetic interference input in the outline interface, thereby improving the anti-interference ability of the wireless communication device, ensuring the stability of program in the wireless communication device and avoiding network disconnection as much as possible. Therefore, the wireless communication quality of the air conditioner using the wireless communication device can be improved, thus the user experience is improved accordingly.

Figure 7:
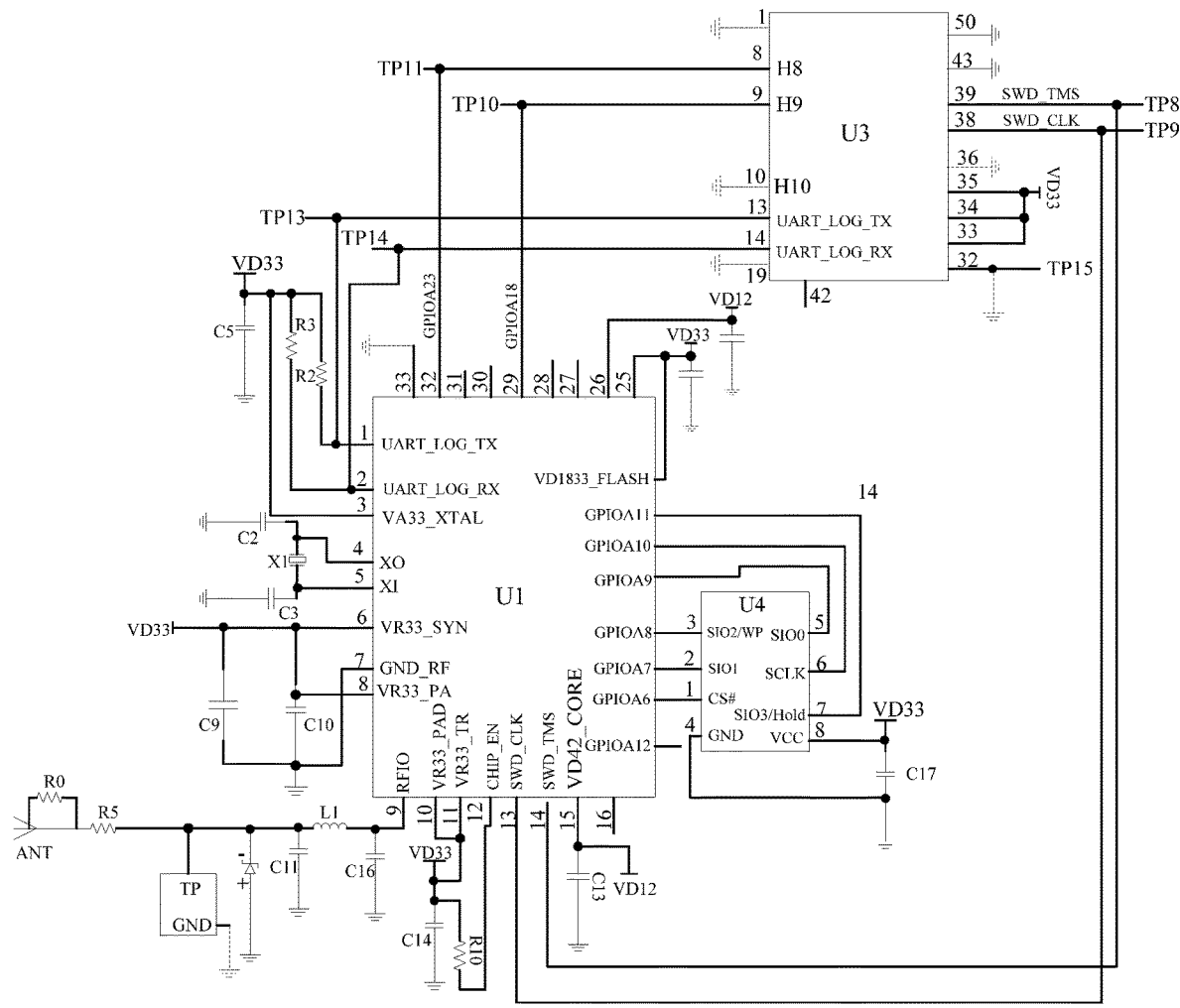
FIG. 7 is a schematic diagram showing connection relationship between components of a wireless communication device of embodiments of the present disclosure.

FIG. 7 is a schematic diagram of the connection relationship of components in a wireless communication device of embodiments of the present disclosure. In FIG. 7, U1 represents the main control chip, U3 represents the outline interface, and U4 represents the memory chip. As shown in FIG. 7, the reset pin (CHIP_EN) of the main control chip is disconnected from respective input pin of the outline interface, so that the input voltage level of reset pin of the main control chip is not affected when the input terminal of the outline interface is interfered by an external electromagnetic signal. The debug serial port input pin (UART_LOG_RX) of the main control chip is connected to the direct-current power source through a fixed-value resistor R3, so as to ensure that the UART_LOG_RX pin is input at a stable high-voltage level. Thus, the purpose of provision of the anti-interference ability to the wireless communication device is achieved.

It can be seen from FIG. 7 that the main control chip also includes a clock signal pin SWD_CLK and a test mode strobe pin SWD_TMS, in which, the SWD_CLK pin is connected to a pin 38 of the outline interface, and the SWD_TMS pin is connected to a pin 39 of the outline interface. A resistor R0 is connected to the antenna and configured to determine whether a resistor is to be attached according to actual needs. For example, for overseas projects, the resistor R0 is attached with a 0 ohm resistor; but for domestic projects, the resistor R0 is not attached with a resistor, thus meeting different needs.

The present disclosure further proposes an air conditioner including the wireless communication device described in the foregoing embodiments. Since adopting all the technical solutions of all the foregoing embodiments, the air conditioner at least has all the beneficial effects of the technical solutions, thus exhibits a good wireless communication quality.

In the description of this specification, descriptions with reference to the terms "one embodiment," "some embodiments," "examples," "specific examples" or "some examples" and the like mean that specific features, structures, materials or characteristics described in conjunction with the embodiment or example are included in at least one embodiment or example of the present disclosure. In this specification, the schematic representations of the above terms do not necessarily refer to the same embodiment or example. Moreover, the described specific features, structures, materials or characteristics can be combined in any one or more embodiments or examples in a suitable manner. In addition, those skilled in the art can combine the different embodiments or examples as well as the features of the different embodiments or examples described in this specification without contradicting each other.

In addition, the terms "first" and "second" are only used for descriptive purposes and cannot be understood as indicating or implying relative importance or implicitly indicating the number of indicated technical features. Therefore, the features defined with "first" and "second" may explicitly or implicitly include at least one of the features. In the description of the present disclosure, the "plurality" means at least two such as two, three and the like, unless otherwise specifically defined.

It should be understood that each part of the present disclosure can be implemented by hardware, software, firmware, or a combination thereof. In the above embodiments, multiple steps or methods can be implemented by software or firmware stored in a memory and executed by a suitable instruction execution system. For example, if it is implemented by hardware as in another embodiment, it can be implemented by any one or a combination of the following technologies known in the art: discrete logic circuits with a logic gate circuit realizing logic functions for data signals, specific integrated circuits with suitable combined logic gate circuits, programmable gate array (PGA), field programmable gate array (FPGA), or the like.

In addition, the functional units in the various embodiments of the present disclosure may be integrated into one processing module, or each unit may physically exist alone or two or more units may be integrated into one module. The integrated module mentioned as above can be implemented in the form of hardware or in the form of software functional module. If the integrated module is implemented in the form of a software function module and is sold or used as an independent product, it can also be stored in a computer readable storage medium.

The above description is only specific embodiments of the present disclosure, and the protection scope of the present disclosure is not limited thereto. The changes or substitutions can being easily come up with by skilled persons in the art within the technical scope disclosed in the present disclosure should be covered within the scope of this disclosure. Therefore, the protection scope of the present disclosure should be subject to the protection scope of claims.

What is claimed is:

1. A wireless communication device comprising:
   a main control chip including:
      a reset pin configured to reset the main control chip; and
      a debug serial port input pin configured to read and detect a running state of a program performed in the main control chip, the debug serial port input pin being connected to a direct-current power source to receive a stable high voltage level input; and
   an outline interface;
   wherein:
      the reset pin is disconnected from an input pin of the outline interface; and
      the debug serial port input pin of the main control chip is connected to a debug serial port input pin of the outline interface.

2. The wireless communication device according to claim 1, further comprising:
   a fixed-value resistor connected between the debug serial port input pin of the main control chip and the direct-current power source.

3. The wireless communication device according to claim 2, wherein:
   a resistance value of the fixed-value resistor is in a range from 4 kiloohms to 20 kiloohms; and an input voltage level of the debug serial port input pin is 3.3 volts.

4. The wireless communication device according to claim 1,
wherein the direct-current power source is a first direct-current power source;
the wireless communication device further comprising:
a capacitor, one end of the capacitor being connected to a second direct-current power source and another end of the capacitor being grounded; and
a resistor, one end of the resistor being connected to the reset pin and another end of the resistor being connected to the second direct-current power source.

5. The wireless communication device according to claim 1, further comprising:
a clock oscillator circuit including:
a crystal;
a first capacitor, one end of the first capacitor being connected to one end of the crystal and another end of the first capacitor being grounded; and
a second capacitor, one end of the second capacitor being connected to another end of the crystal and another end of the second capacitor being grounded;
wherein the main control chip further includes:
a crystal oscillator input pin connected to the one end of the crystal; and
a crystal oscillator output pin connected to the other end of the crystal.

6. The wireless communication device according to claim 1, further comprising:
a memory chip including four serial data input and output pins, a clock input pin, an enable pin, a ground pin, and a power supply pin that are connected to different general-purpose input and output pins of the main control chip, respectively.

7. The wireless communication device according to claim 6, further comprising:
a power supply circuit, input ends of the power supply circuit being respectively connected to a power supply pin of the main control chip, a power supply pin of the outline interface, and the power supply pin of the memory chip.

8. The wireless communication device according to claim 1, further comprising:
a memory chip including four serial data input and output pins, a clock input pin, an enable pin, a ground pin, and a power supply pin that are connected to different general-purpose input and output pins of the main control chip, respectively;
wherein:
the four serial data input and output pins include a protection pin and a Hold pin;
when the protection pin is input at a low voltage level, data cannot be erased and modified; and
when the Hold pin is input at a low voltage level, the main control chip ignores all external commands to prevent a mistaken operation.

9. The wireless communication device according to claim 1, wherein the main control chip further includes a radio frequency input and output pin connected to an antenna and configured to receive and send data through the antenna.

10. The wireless communication device according to claim 9, wherein the radio frequency input and output pin is connected to the antenna through an inductor.

11. An air conditioner comprising:
a wireless communication device including:
a main control chip including:
a reset pin configured to reset the main control chip; and
a debug serial port input pin configured to read and detect a running state of a program performed in the main control chip, the debug serial port input pin being connected to a direct-current power source to receive a stable high voltage level input; and
an outline interface;
wherein:
the reset pin is disconnected from an input pin of the outline interface; and
the debug serial port input pin of the main control chip is connected to a debug serial port input pin of the outline interface.

12. The air conditioner according to claim 11, wherein the wireless communication device further includes:
a fixed-value resistor connected between the debug serial port input pin of the main control chip and the direct-current power source.

13. The air conditioner according to claim 12, wherein:
a resistance value of the fixed-value resistor is in a range from 4 kiloohms to 20 kiloohms; and
an input voltage level of the debug serial port input pin is 3.3 volts.

14. The air conditioner according to claim 11, wherein:
the direct-current power source is a first direct-current power source; and
the wireless communication device further includes:
a capacitor, one end of the capacitor being connected to a second direct-current power source and another end of the capacitor being grounded; and
a resistor, one end of the resistor being connected to the reset pin and another end of the resistor being connected to the second direct-current power source.

15. The air conditioner according to claim 11, wherein the wireless communication device further includes:
a clock oscillator circuit including:
a crystal;
a first capacitor, one end of the first capacitor being connected to one end of the crystal and another end of the first capacitor being grounded; and
a second capacitor, one end of the second capacitor being connected to another end of the crystal and another end of the second capacitor being grounded;
wherein the main control chip further includes:
a crystal oscillator input pin connected to the one end of the crystal; and
a crystal oscillator output pin connected to the other end of the crystal.

16. The air conditioner according to claim 11, wherein the wireless communication device further includes:
a memory chip including four serial data input and output pins, a clock input pin, an enable pin, a ground pin, and a power supply pin that are connected to different general-purpose input and output pins of the main control chip, respectively.

17. The air conditioner according to claim 16, wherein the wireless communication device further includes:
a power supply circuit, input ends of the power supply circuit being respectively connected to a power supply pin of the main control chip, a power supply pin of the outline interface, and the power supply pin of the memory chip.

18. A wireless communication device comprising:
a main control chip including:

a reset pin configured to reset the main control chip; and
a debug serial port input pin configured to read and detect a running state of a program performed in the main control chip, the debug serial port input pin being connected to a direct-current power source to receive a stable high voltage level input; and an outline interface; and a fixed-value resistor;

wherein:

the reset pin is disconnected from an input pin of the outline interface; and the debug serial port input pin of the main control chip and a debug serial port input pin of the outline interface are connected to each other and are both connected to a first end of the fixed-value resistor, a second end of the fixed-value resistor being connected to the direct-current power source.

* * * * *